United States Patent
Holyoak et al.

(12)

(10) Patent No.: US 10,955,802 B2
(45) Date of Patent: Mar. 23, 2021

(54) MECHANICAL INPUT/OUTPUT SELECTOR

(71) Applicant: Raytheon Company, Waltham, MA (US)

(72) Inventors: Vonn Holyoak, Vail, AZ (US); Samuel R. Nielsen, Tucson, AZ (US); Robert E. Munger, Sonoita, AZ (US)

(73) Assignee: Raytheon Company, Waltham, MA (US)

( * ) Notice: Subject to any disclaimer, the term of this patent is extended or adjusted under 35 U.S.C. 154(b) by 145 days.

(21) Appl. No.: 16/110,780

(22) Filed: Aug. 23, 2018

(65) Prior Publication Data

US 2020/0064802 A1 Feb. 27, 2020

(51) Int. Cl.
  *G05B 19/042* (2006.01)
  *H03K 19/17736* (2020.01)
  *H03K 19/17788* (2020.01)

(52) U.S. Cl.
  CPC ...... *G05B 19/0423* (2013.01); *G05B 2219/21* (2013.01); *H03K 19/17744* (2013.01); *H03K 19/17788* (2013.01)

(58) Field of Classification Search
  CPC ...... H01H 63/02; H01H 67/06; H01H 36/006; H01H 63/06; H01H 67/26; H01H 19/563; H01H 9/0027; G05B 19/0423; G05B 2219/21; H03K 19/17744; H03K 19/17788
  See application file for complete search history.

(56) References Cited

U.S. PATENT DOCUMENTS

| 2,844,656 | A | | 7/1958 | Lohs | |
|---|---|---|---|---|---|
| 4,514,602 | A | * | 4/1985 | Owen | H01H 9/0005 200/16 C |
| 2003/0000813 | A1 | * | 1/2003 | Roos | H01H 67/22 200/1 R |
| 2014/0131182 | A1 | * | 5/2014 | Leccia | H02B 11/02 200/238 |

FOREIGN PATENT DOCUMENTS

EP 2261935 A1 12/2010
WO WO 2011/076259 A1 6/2011

OTHER PUBLICATIONS

International Search Report for International Application No. PCT/US2019/037764 dated Sep. 20, 2019, 12 pages.

\* cited by examiner

*Primary Examiner* — Ahmed M Saeed

(57) ABSTRACT

A mechanical input/output selector is disclosed. The mechanical input/output selector can include a first terminal for a first transmission line. The mechanical input/output selector can also include a plurality of second terminals for a plurality of second transmission lines. The mechanical input/output selector can further include a first displacement device operable to selectively position the first terminal proximate to any one of the plurality of second terminals. Additionally, the mechanical input/output selector can include a second displacement device operable to move the first terminal relative to the plurality of second terminals to alternately connect and disconnect the first terminal and one of the plurality of second terminals. Associated systems and methods are also provided.

19 Claims, 6 Drawing Sheets

MECHANICAL INPUT/OUTPUT SELECTOR

BACKGROUND

A wide variety of applications require switching of input/output (I/O) signals and power, which is traditionally accomplished using electrical multiplexers. Some applications require switching of a high volume of signals and high power (i.e., voltage/current), such as for testing various components in a test cell. Electrical multiplexers are capable of switching signal channels but are limited to low power applications. As a result, switching of high power lines typically requires the use of relays to control the path of current to the multiplexers and often requires human intervention. In some of these applications (e.g., testing components isolated in a test cell) autonomous switching is required as human interaction may not be desirable or feasible.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
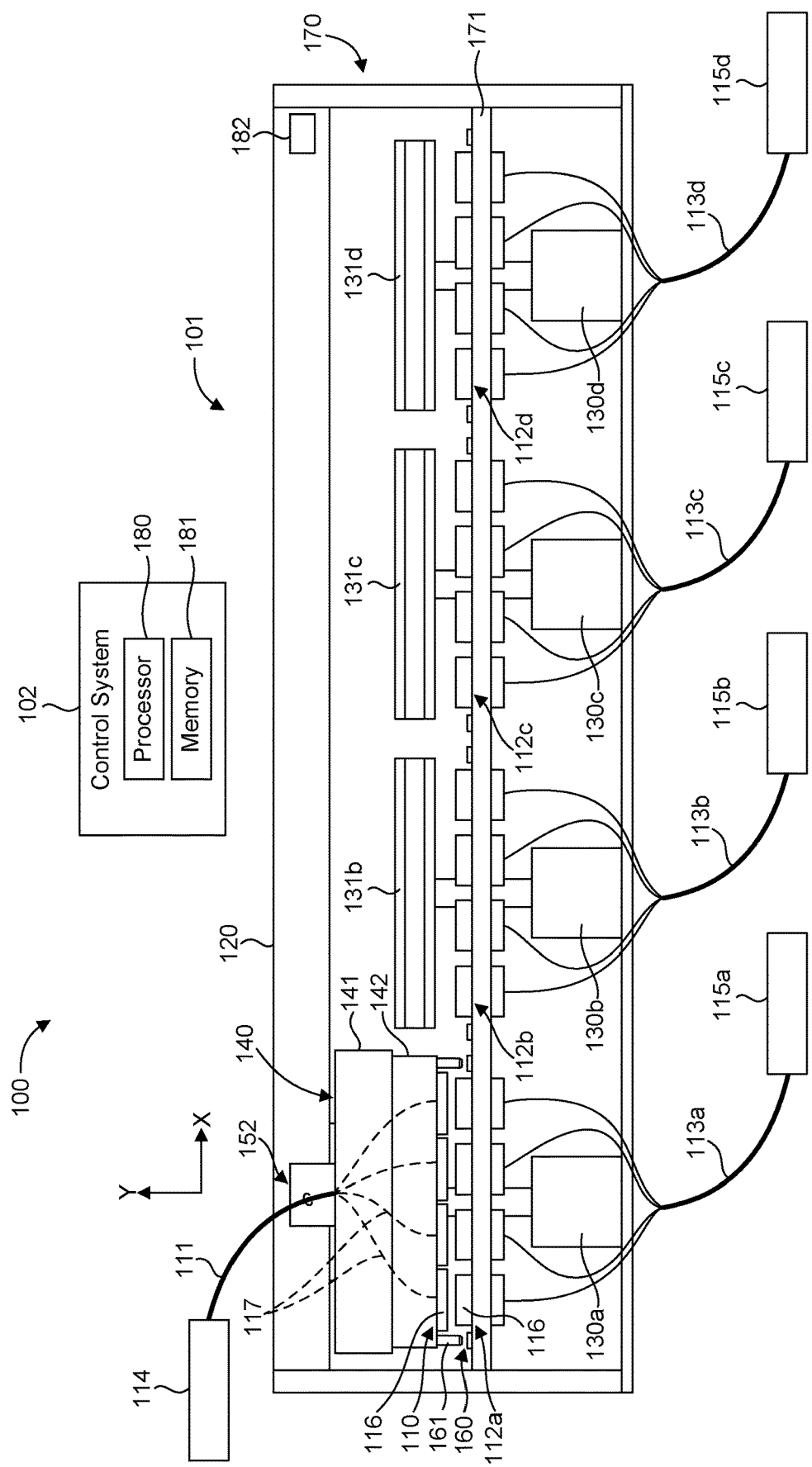
FIG. 1 is a side view of a mechanical input/output selector system in a disconnected configuration, in accordance with an example of the present disclosure.

Reference will now be made to the examples illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

As mentioned above, electrical multiplexers can be effectively utilized for signal switching and low power applications but require relays to enable use in high power applications. High volume multiplexing applications require additional electrical cables and can give rise to cable management and space concerns, which may preclude the use of electrical multiplexers in some applications. In addition, electrical multiplexers suffer from signal degradation and the control mechanisms are complex. While mechanical mass interconnects may avoid these cable management and space issues as well as the signal degradation concerns related to electrical multiplexers, mechanical interconnects require human intervention to perform the switching, which may not be desirable or feasible.

Accordingly, a mechanical input/output selector is disclosed that can mechanically switch high power lines and a high number of signal lines simultaneously. In one aspect, the mechanical input/output selector can perform the switching autonomously and without human intervention. The mechanical input/output selector can include a first terminal for a first transmission line. The mechanical input/output selector can also include a plurality of second terminals for a plurality of second transmission lines. The mechanical input/output selector can further include a first displacement device operable to selectively position the first terminal proximate to any one of the plurality of second terminals. Additionally, the mechanical input/output selector can include a second displacement device operable to move the first terminal relative to the plurality of second terminals to alternately connect and disconnect the first terminal and one of the plurality of second terminals.

A mechanical input/output selector system is also disclosed. The mechanical input/output selector system can comprise a mechanical input/output selector. The mechanical input/output selector can include a first terminal for a first transmission line. The mechanical input/output selector can also include a plurality of second terminals for a plurality of second transmission lines. The mechanical input/output selector can further include a first displacement device operable to selectively position the first terminal proximate to any one of the plurality of second terminals. In addition, the mechanical input/output selector can include a second displacement device operable to move the first terminal relative to the plurality of second terminals to alternately connect and disconnect the first terminal and one of the plurality of second terminals. The mechanical input/output selector system can also comprise a control system to control operation of the first and second displacement devices.

To further describe the present technology, examples are now provided with reference to the figures. With reference to FIG. 1, one example of a mechanical input/output selector system 100 is illustrated. The system 100 can comprise a mechanical input/output selector 101, and a control system 102 to control operation of the selector 101.

The mechanical input/output selector 101 can include a terminal 110 for a transmission line 111, and terminals 112a-d for respective transmission lines 113a-d. The transmission lines 111, 113a-d can be coupled to respective devices 114, 115a-d, which can be of any suitable type (e.g., electronic, mechanical, electromechanical, pneumatic, hydraulic, etc. alone or in any combination). In one example, the device 114 can be an output device and the devices 115a-d can be input devices that receive input from the output device 114. For example, the devices 115a-d can be test devices or platforms and the device 114 can provide input to perform tests on the test devices 115a-d.

Figure 2:
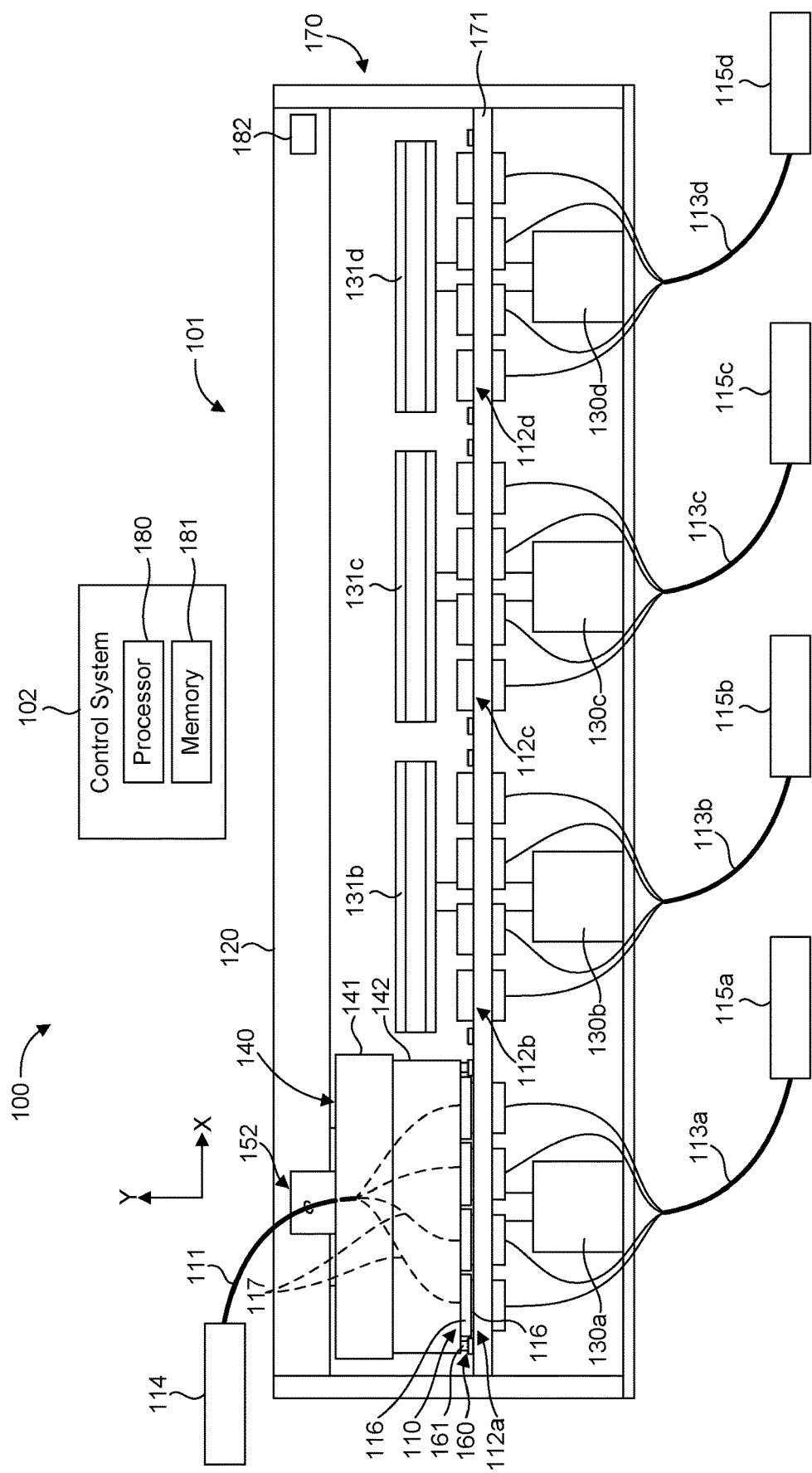
FIG. 2 is a side view of the mechanical input/output selector system of FIG. 1 in a connected configuration, in accordance with an example of the present disclosure.
Figure 3:
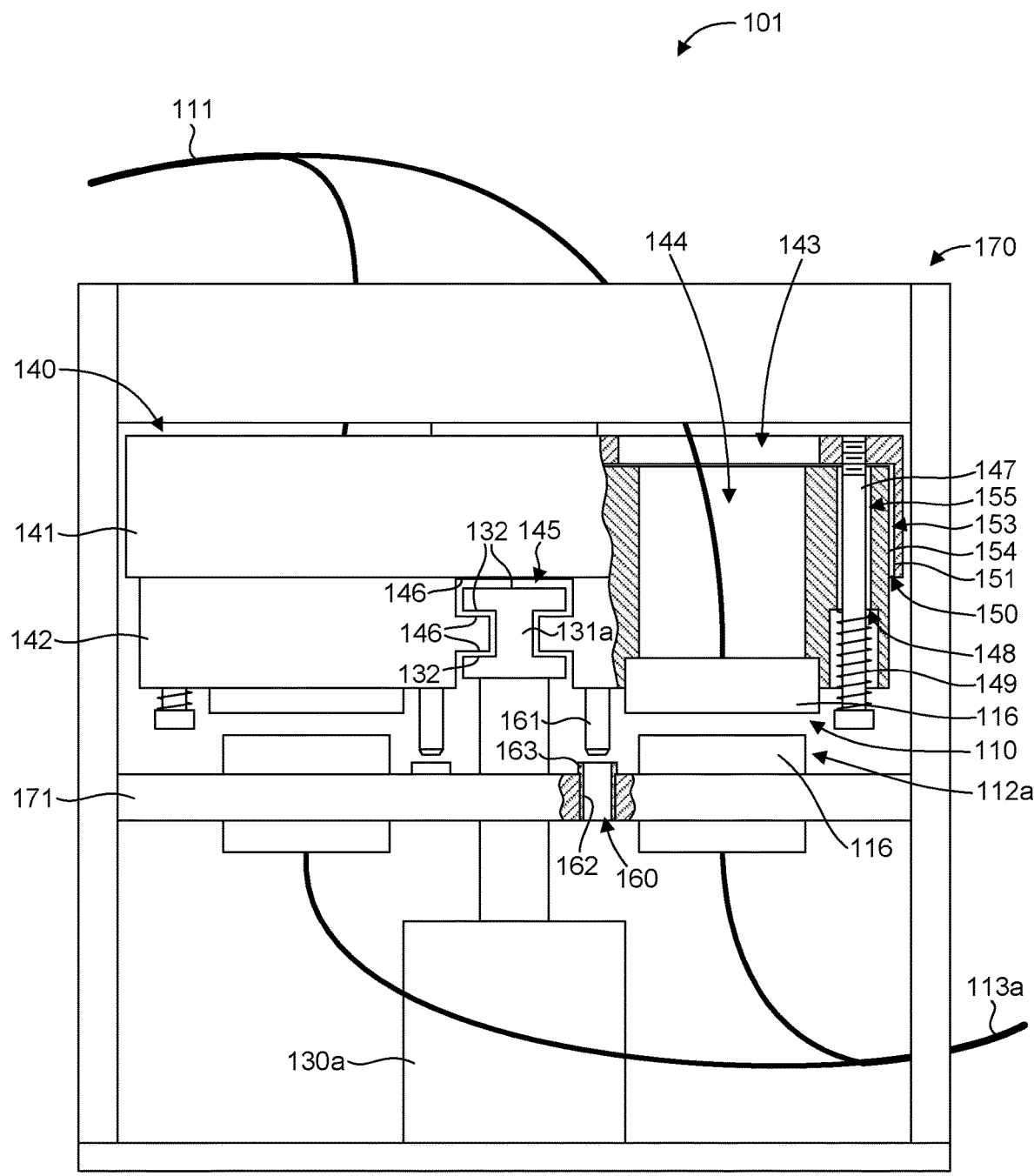
FIG. 3 is an end view of a mechanical input/output selector of the system of FIG. 1 in a disconnected configuration, in accordance with an example of the present disclosure.
Figure 4:
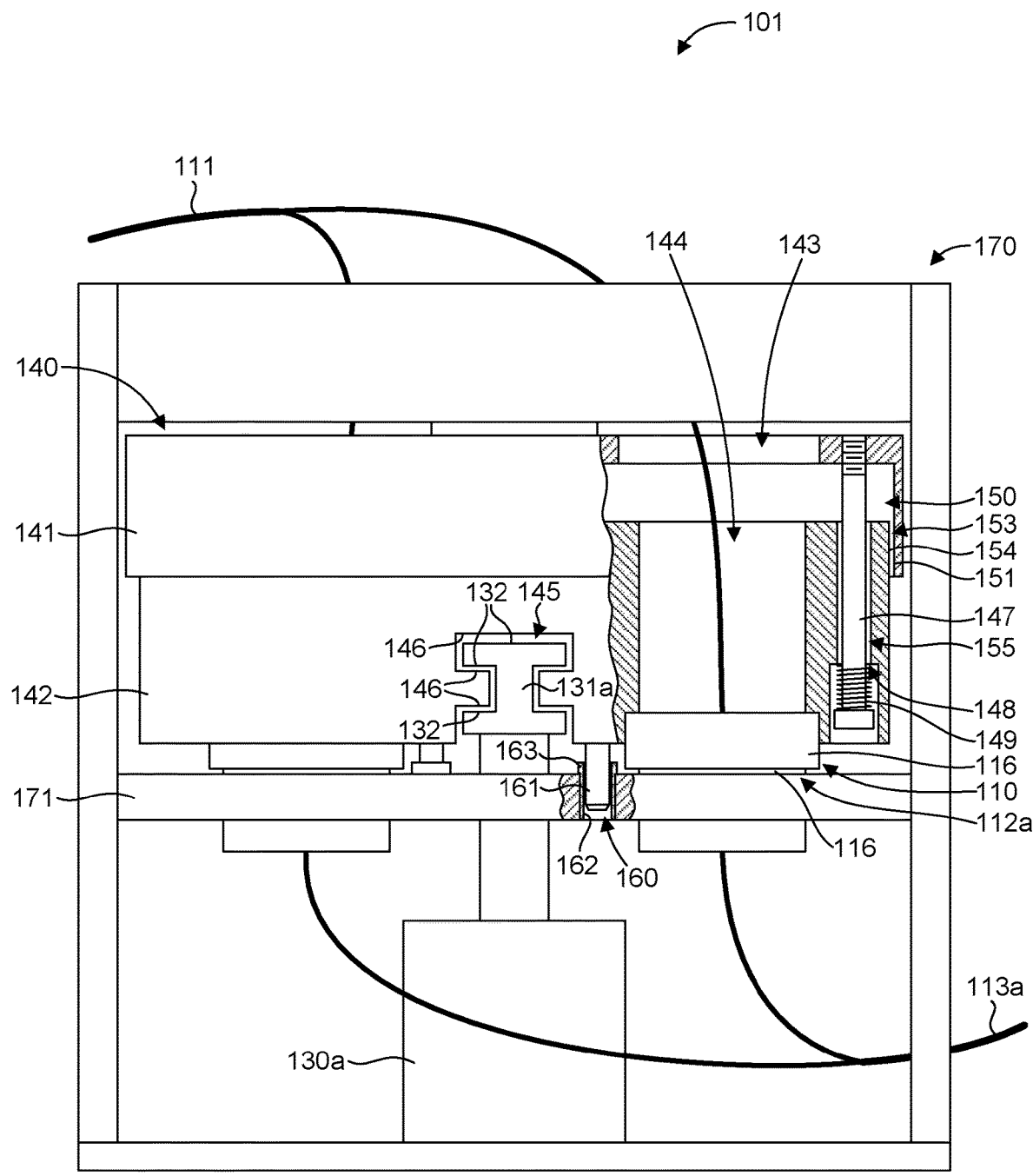
FIG. 4 is an end view of a mechanical input/output selector of the system of FIG. 1 in a connected configuration, in accordance with an example of the present disclosure.

As described in more detail below, the terminal 110 can be physically engaged with and disengaged from the terminals 112a-d to selectively couple the transmission line 111 with any of the transmission lines 113a-d. FIG. 1 shows the terminal 110 disconnected from the terminals 112a-d. FIG. 2 shows the terminal 110 connected to one of the terminals 112a-d, specifically, the terminal 112a. FIGS. 3 and 4 show end views of the selector 101 with terminals in disconnected and connected configurations, respectively.

Figure 5A:
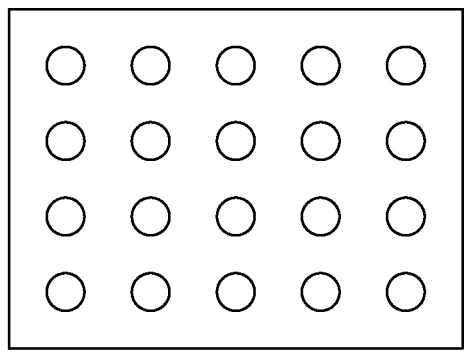
FIGS. 5A-5C illustrate representations of connectors that can be included in a mechanical input/output selector, in accordance with several examples of the present disclosure.
Figure 5B:
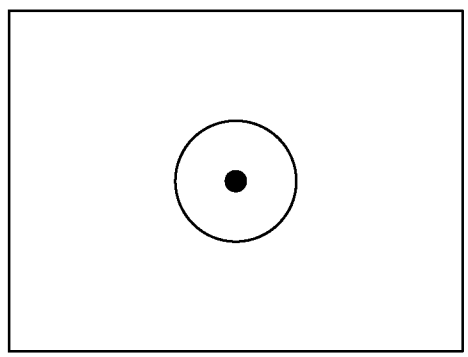
Figure 5C:
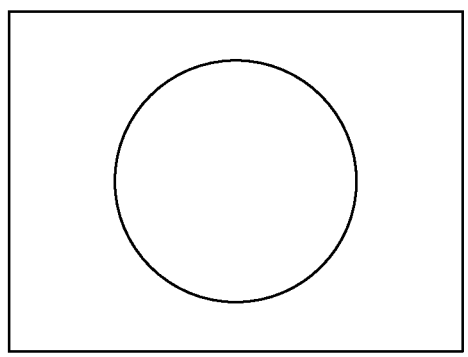

The transmission lines 111, 113a-d can be of any suitable type (e.g., an electrical cable (e.g., for power, signals, and/or data transfer), an optical cable (e.g., for signal and/or data transfer), a hydraulic hose (e.g., for pressurized hydraulic fluid, coolant, etc.), a pneumatic hose (e.g., for pressurized gas, a vacuum line, etc.), etc. in any combination). In some examples, the transmission lines 111, 113a-d can include a bundle of similar or dissimilar transmission lines. The terminals 110, 112a-d can each comprise one or more connectors 116 adapted to operably couple the transmission line 111 to one or more of the transmission lines 113a-d. The connectors 116 can be of any suitable type, such as an electrical connector, a fluid connector (e.g., a pneumatic connector, a hydraulic connector, etc.), a fiber optic connector, etc. FIGS. 5A-5C illustrate representations of an electrical pin connector, a coaxial connector, and a fluid connector (e.g., a pneumatic or hydraulic connector), respectively. The connectors contemplated herein can be of any suitable type or design known in the art or a customized design. Although not explicitly illustrated, it should be recognized that the connectors can include securing features and/or mechanisms for actuating such securing features. For example, a pneumatic connector may include a securing ring typically found in "quick connect" pneumatic connectors and the connector may include an actuator operable to engage/disengage the securing ring.

With further reference to FIGS. 1 and 2, in one aspect, a transmission line can comprise multiple lines 117, which can be of the same or different types of cables, hoses, etc. Accordingly, the various terminals 110, 112a-d can comprise any suitable type of connector 116 operable to connect a given type of cable, hose, etc. In one aspect, the transmission lines 113a-d and the respective terminals 112a-d may include the same or a different combination of cables or hoses and associated connectors than that of another one. In addition, the transmission line 111 and the terminal 110 can include the types of cables and associated connectors found among the transmission lines 113a-d and the respective terminals 112a-d to enable coupling the terminal 110 to any one of the terminals 112a-d. For example, the transmission line 113a can include only a power cable, an electrical data transfer cable, and a hydraulic hose with the terminal 112a having the appropriate connectors for making connections with these types of cables and hoses. The transmission line 113b can include only a power cable and an optical data transfer cable with the terminal 112b having the appropriate connectors. In this case, the transmission line 111 can include an electrical power cable, an electrical data transfer cable, an optical data transfer cable, a hydraulic hose, and a pneumatic hose with the terminal 110 having the appropriate connectors. When the transmission line 111 is coupled to the transmission line 113a via the respective terminals 110, 112a, the electrical power cables, the electrical data transfer cables, and the hydraulic hoses of the transmission lines 111, 113a can be coupled to one another, while the optical data transfer cable and the pneumatic hose of the transmission line 111 remain uncoupled due to the absence of these types of cables and hoses in the transmission line 113a and of mating connectors in the terminal 112a. When the transmission line 111 is coupled to the transmission line 113b via the respective terminals 110, 112b, the electrical power cables and the optical data transfer cables of the transmission lines 111, 113a may be coupled to one another, while the electrical data transfer cable, the hydraulic hose, and the pneumatic hose of the transmission line 111 remain uncoupled due to the absence of these types of cables and hoses in the transmission line 113b and of mating connectors in the terminal 112b. The terminal 110 can therefore be configured to accommodate every type of transmission line connected to the various terminals 112a-d even if the terminals 112a-d differ in some way.

A selector device in accordance with the present technology can therefore be used to provide connections of various types of transmission lines (e.g., electrical, optical, hydraulic, pneumatic, etc.) in any combination. Thus, transmission lines of "physical" media (e.g., hydraulic, pneumatic, etc.) can be connected/disconnected by the same mechanism and at the same time as electrical or optical transmission lines.

In some examples, the terminals 112a-d and associated respective transmission lines 113a-d can serve as "input" channels (e.g., from multiple output devices 115a-d), and the terminal 110 and associated transmission line 111 can serve as an "output" channel (e.g., to an input device 114). Thus, one of the several input channels can be selected for coupling with a single output channel. In this case, the selector 101 can function in a manner similar to an electronic multiplexer (e.g., a "mux"), which may serve as a type of multiple-input, single-output switch making it possible for several output sources 115a-d to share one device 114. Conversely, the terminal 110 and associated transmission line 111 can serve as an "input" channel (e.g., from an output device 114), and the terminals 112a-d and associated respective transmission lines 113a-d can serve as "output" channels (e.g., to input devices 115a-d). Thus, one of the several output channels can be selected for coupling with a single input channel. In this case, the selector 101 can function in a manner similar to an electronic demultiplexer (e.g., a "demux"), which may serve as a type of single-input, multiple-output switch making it possible for one output source 114 to serve several devices 115a-d. In some examples, multiple selectors 101 can be coupled together with one selector functioning as a multiplexer and another selector functioning as a demultiplexer. It should be recognized that designating "input" and "output" channels does not dictate that the direction of transmissions through the channels is necessarily from "input" to "output." Depending on the application, transmissions may be conveyed through "input" and "output" channels in any direction (i.e., from "input" to "output" and/or from "output" to "input," e.g., for two-way communication).

One aspect of the present technology is mechanical connection/disconnection (i.e., physical engagement/disengagement) of the terminal 110 and the terminals 112a-d. For electrical connections, such mechanical engagement can enable better control of signal integrity compared to that available from an electronic switch (e.g., switching via electronic circuitry), because a mechanical connection provides only a single interface of conductors where degradation can occur, while an electronic switch has many switches in its circuitry that degrade signals. As a result, the mechanical connections of the present technology can provide superior signal to noise ratio (SNR) compared to electronic switches.

The mechanical input/output selector 101 can include a selection displacement device 120 operable to selectively position the terminal 110 proximate to any one of the terminals 112a-d. In the illustrated example, the terminals 112a-d can be linearly arranged in a direction parallel to an X-axis, and the displacement device 120 can be configured to move in a direction parallel to the X-axis (e.g., horizontally) to position the terminal 110 proximate to any one of the terminals 112a-d. For example, the displacement device 120 can position the terminal 110 at the same X-axis coordinate as any one of the terminals 112a-d, which in the illustrated example is vertically above the terminals 112a-d.

The mechanical input/output selector 101 can also include one or more connection displacement devices 130a-d operable to move the terminal 110 relative to the respective terminals 112a-d to alternately connect and disconnect the terminal 110 and one of the terminals 112a-d. In the illustrated example, the displacement devices 130a-d can be configured to move in a direction parallel to a Y-axis, which is orthogonal to the X-axis, to vertically position the terminal 110 to connect and disconnect the terminal 110 and one of the terminals 112a-d, as explained in more detail below.

The displacement devices 120, 130a-d can be or include any suitable type of device or mechanism that can cause relative displacement between two bodies. In some examples, one or more of the displacement devices 120, 130a-130d can comprise a linear actuator, such as a linear positioning system, an electric actuator, a hydraulic actuator, a pneumatic actuator, etc. Although the terms "horizontal" and "vertical" have been used herein to describe operation of the displacement devices 120, 130a-d, it should be recognized that these terms have been used in a relative context applicable to the illustrations.

With further reference to FIGS. 1 and 2, and particular reference to FIGS. 3 and 4, in one aspect the mechanical input/output selector 101 can include a carriage 140 coupled to the displacement device 120 and that supports the terminal 110. The carriage 140 can be moved by the displacement device 120 to position the terminal 110 relative to the terminals 112a-d along the X-axis. In the illustrated example, the carriage 140 can comprise a base 141 coupled (e.g., directly coupled) to the displacement device 120. The carriage 140 can also comprise a movable platform 142 movably coupled to the base 141 to facilitate movement of the movable platform 142 parallel to the Y-axis. The movable platform 142 can be coupled to the terminal 110 (e.g., directly coupled) and can support the terminal 110. The movable platform 142 can therefore position the terminal 110 relative to the terminals 112a-d along the Y-axis to connect and disconnect the terminal 110 and one of the terminals 112a-d. In some examples, the movable platform 142 can be configured to fit at least partially within a platform opening 150 of the base 141. The platform opening 150 can be at least partially defined by base sidewalls 151.

The base 141 and the movable platform 142 can also include respective transmission line openings 143, 144 to facilitate routing the transmission line 111 through the carriage 140 to the terminal 110. A transmission line guide 152 can be coupled to the base 141 (as shown in FIGS. 1 and 2) or to the movable platform 142 support and guide the transmission line 111 to prevent excessive bending of the transmission line 111 (i.e., serve as a strain relief) and prevent rubbing of the transmission line 111 on neighboring components, such as the displacement device 120. The transmission line 111 can be coupled to the transmission line guide 152 in any suitable manner, such as with a clip, cable tie, band, wire, etc.

In the illustrated example, the movable platform 142 can be movable relative to the base 141 by the displacement devices 130a-d, each of which is associated with one of the terminals 112a-d. For example, the movable platform 142 can have an interface opening 145. The displacement devices 130a-d can include or be coupled to respective platform interfaces 131a-d configured to be received within the interface opening 145 to facilitate coupling the displacement devices 130a-d with the movable platform 142. The platform interfaces 131a-d can have any suitable configuration (e.g., a rail, bar, or rod configuration). The interface opening 145 can have any suitable complementary or mating configuration operable to receive and interface with the platform interfaces 131a-d. For example, the platform interfaces 131a-d can have one or more platform interface surfaces 132, as shown in FIGS. 3 and 4. In the illustrated example, the platform interface surfaces 132 serve to define an I-beam cross-section of the platform interfaces 131a-d. The interface opening 145 can have one or more displacement device interface surfaces 146 configured to interface with (e.g., bear against) the platform interface surfaces 132. The configuration of platform interface surfaces 132 and displacement device interface surfaces 146 can enable the displacement devices 130a-d to impart force on the movable platform 142 to cause bi-directional movement of the movable platform 142. Thus, the displacement devices 130a-d can draw the movable platform 142 toward the respective terminals 112a-d for connecting with the terminal 110, and the displacement devices 130a-d can push the movable platform 142 away from the respective terminals 112a-d for disconnecting from the terminal 110.

In some examples, the movable platform 142 can be biased toward the base 141. For example, the movable platform 142 and the base 141 can be coupled to one another by one or more fasteners 147 (e.g., bolts, screws, etc.), which can extend through fastener openings 148 in the movable platform 142 and can be secured to the base 141 (e.g., by threaded coupling features). The fasteners 147 can capture a spring 149 (e.g., a compression spring), which can bear against the movable platform 142. The spring 149 can be configured to provide a biasing force against the movable platform 142 sufficient to maintain the movable platform 142 against the base 141 in the absence of external forces provided by the displacement devices 130a-d. In some examples, the spring 149 can be preloaded. In some examples, the spring 149, the fastener 147, and the movable platform 142 can be configured to facilitate a range of motion of the movable platform 142 relative to the base 141 sufficient to engage the terminal 110 with the terminals 112a-d without fully compressing the spring 149.

In one aspect, the selector 101 can be configured to facilitate correct alignment when connecting the terminal 110 and one of the terminals 112a-d. For example, one or more guide openings 160 can be associated with and positioned relative to one or more of the terminals 112*a-d*, and one or more guide pins 161 can be associated with and positioned relative to the terminal 110. The guide pins 161 can be configured to fit within the guide openings 160 and interface with a sidewall 162 of the guide openings 160. The relative size of the guide pins 161 and guide openings 160, as well as the relative position of the guide pins 161 to the terminal 110 and of the guide openings 160 to the terminals 112*a-d* can be configured to ensure proper alignment of the terminal 110 with the terminals 112*a-d*. In some examples, the guide pins 161 can include a chamfered tip to facilitate engagement of the guide pins 161 with the guide opening sidewall 162. In addition, or as an alternative, an entrance portion of the guide opening 160 can include a chamfered sidewall (not shown) to facilitate engagement of the guide pins 161 with the guide opening sidewall 162. A lateral gap 153 between the base sidewalls 151 and a side surface 154 of the movable platform 142 and a lateral gap 155 between the fastener 147 and a sidewall of the fastener opening 148 can enable enough free lateral motion between the movable platform 142 and the base 141 to allow the interaction between the guide pins 161 and the guide opening sidewall 162 to establish the lateral position of the movable platform 142 and therefore establish proper alignment of the terminal 110 with the terminals 112*a-d* when coupling. In one aspect, the guide pins 161 can be configured to enter the guide openings 160 and engage the guide opening sidewall 162 prior to contact between the terminal 110 and the terminals 112*a-d* to ensure proper alignment of the terminals and avoid damage. Thus, the displacement device 120 can provide "rough" positioning of the terminal 110 relative to the terminals 112*a-d* in the X-axis, and the guide pins 161 and guide openings 160 can provide precise alignment of the terminal 110 relative to the terminals 112*a-d* in the X-axis while a given displacement device 130*a-d* moves the terminal 110 into engagement with a respective terminal 112*a-d*.

In one aspect, the selector 101 can include a support frame 170. The support frame 170 can serve to support various components of the system 100, such as the displacement device 120, the displacement devices 130*a-d*, and the terminals 112*a-d*. In one example, the support frame 170 can include a support plate 171 to which the displacement devices 130*a-d* are mounted. The support frame 170 can position the displacement device 120 above the support plate 171, with space between to accommodate the carriage 140 and travel of the movable platform 142 relative to the base 141 for connecting/disconnecting the terminal 110 and the terminals 112*a-d*. The support frame 170 can also be configured to support the displacement devices 130*a-d* and position the support plate 171 generally above the displacement devices 130*a-d*. The support plate 171 can include holes or openings (not shown) such that portions of the displacement devices 130*a-d* can extend through the support plate 171 to facilitate engagement with the movable platform 142 via the platform interfaces 131*a-d*.

In the illustrated example, the guide openings 160 can be associated with the support frame 170 (i.e., the support plate 171), and the guide pins 161 can be associated or otherwise included with the movable platform 142. In some examples, the guide openings 160 can be defined by guide bushings 163, which can be mounted on the support plate 171. Although the guide pin 161 is shown associated with the movable platform 142, and the guide opening 160 is associated with the support frame 170, it should be recognized that a guide opening can be associated with the movable platform 142 and a guide pin can be associated with the support frame 170.

In one aspect, the control system 102 can control operation of the displacement devices 120, 130*a-d*. The control system 102 can include any suitable hardware (e.g., a processor 180 and memory 181), software, etc. typically used in control systems to enable open loop and/or closed loop control of the displacement devices 120, 130*a-d*. For example, the control system 102 can be configured to provide "servo" control of the displacement device 120. The system 100 can include a position sensor 182 to provide position feedback data (e.g., position data of the displacement device 120) for the control system 102 to position the terminal 110 relative to the various terminals 112*a-d*. In one example, the displacement devices 120, 130*a-d* comprise pneumatic actuators, and the control system 102 comprises a servo pneumatic controller that can provide servo control of the displacement device 120 as well as solenoid valve control of the displacement devices 130*a-d* to position the terminal 110 proximate a given terminal 112*a-d* and coordinate connection/disconnection with the displacement devices 130*a-d*.

In use, the control system 102 can operate to connect/disconnect the terminal 110 with any of the terminals 112*a-d*. In general, the displacement device 120 can actuate to position the carriage 140 at one of several discrete locations to locate the terminal 110 over or proximate a selected mating terminal 112*a-d*. The displacement device 130*a-d* associated with the selected terminal 112*a-d* can then actuate to draw the terminal 110 toward the mating terminal 112*a-d* and engage (i.e., connect) the terminals. When desired, the displacement device 130*a-d* can actuate to push the terminal 110 away from the mating terminal 112*a-d* and disengage (i.e., disconnect) the terminal 110 from the terminal 112*a-d*. This process can be repeated for connecting the terminal 110 to a different selected mating terminal 112*a-d*. In an example of this operation, the terminal 110 can be connected to the terminal 112*a*. In this case, the displacement device 120 can position the terminal 110 proximate the terminal 112*a*. The displacement device 130*a* can then actuate to connect the terminals 110, 112*a*. When desired, the displacement device 130*a* can actuate to disconnect the terminals 110, 112*a*. The process can be repeated for connecting the terminal 110 to a different selected mating terminal 112*b-d*. In one aspect, the control system 102 can be configured to enable direct operator control and/or to automatically control operation of the displacement devices 120, 130*a-d* for connecting/disconnecting the terminal 110 and the terminals 112*a-d*, such as by executing a programmed sequence/duration of connections. The technology disclosed herein can therefore provide the capability to mechanically mux and/or demux any suitable number of transmission lines (e.g., power, communication signals, data, hydraulic and/or pneumatic control, etc.) to one transmission line with no human interaction during the mechanical interconnect switching process, which can drastically reduce time over a manual switching process.

Figure 6:
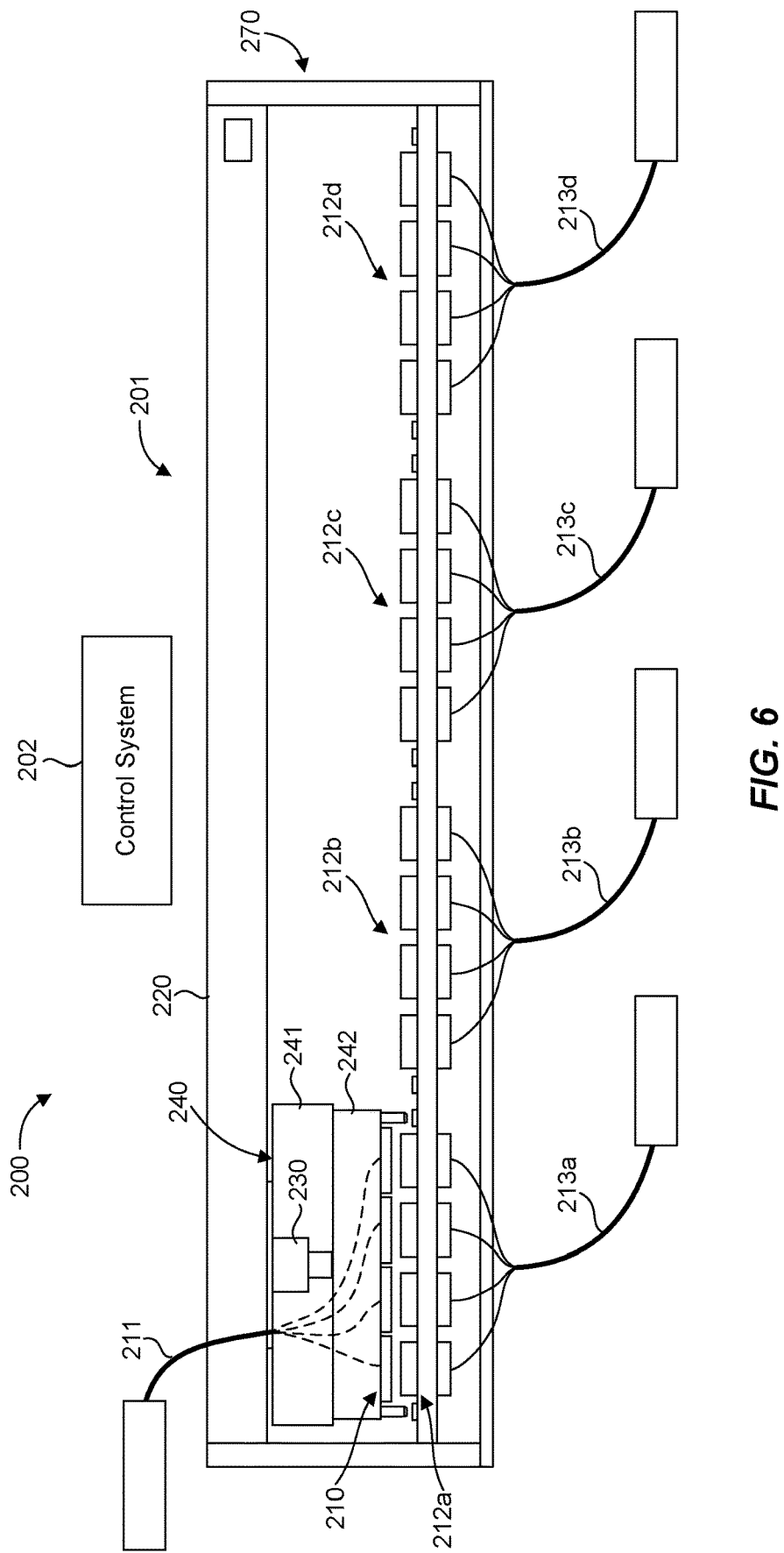
FIG. 6 is a side view of a mechanical input/output selector system in accordance with another example of the present disclosure.

FIG. 6 illustrates a mechanical input/output selector system 200, in accordance with another example of the present disclosure. The system 200 is similar in many respects to the system 100 discussed above with regard to FIGS. 1-4. For example, the system 200 can comprise a mechanical input/output selector 201, and a control system 202 to control operation of the selector 201. As with the selector 101 discussed above, the selector 201 can include a terminal 210 for a transmission line 211, terminals 212*a-d* for respective transmission lines 213a-d, a displacement device 220 operable to selectively position the terminal 210 proximate to any one of the terminals 212a-d, a carriage 240 coupled to the displacement device 220 and that is supporting the terminal 210, and a displacement device 230 operable to move the terminal 210 relative to the respective terminals 212a-d to alternately connect and disconnect the terminal 210 and one of the terminals 212a-d.

In contrast to the displacement devices 130a-d discussed above, which are associated with the respective terminals 112a-d, the displacement device 230 is associated with the carriage 240. Thus, in the example shown in FIG. 6, the displacement device 230 is supported by, and moves with, the carriage 240. The carriage 240 can include a base 240 and a movable platform 242, which can be coupled to the terminal 210. The displacement device 230 can be coupled to the base 241 and the movable platform 242 to cause movement of the movable platform 242 relative to the base 241 to connect and disconnect the terminal 210 and one of the terminals 212a-d. Although only a single displacement device 230 is illustrated, it should be recognized that any suitable number or configuration of displacement devices can be utilized to cause relative movement between the movable platform 242 and the base 241. In some examples, no displacement devices are associated with the terminals 212a-d. Thus, instead of displacement devices associated with the individual terminals 212a-d (similar to the example shown in FIGS. 1 and 2), the displacement device 230 is associated and movable with the carriage 240 to cause connection/disconnection of the terminal 210 and the terminals 212a-d. Accordingly, a support frame 270 can support various components of the system 200, such as the displacement device 220 and the terminals 230a-d, need not be configured to accommodate displacement devices below the terminals 212a-d.

Although the arrangement of the terminals 112a-d, 212a-d and the movement path of the terminals 110, 210 caused by the displacement devices 120, 220 are represented in the figures as linear, it should be recognized that the arrangement of terminals 112a-d, 212a-d can be non-linear (e.g., curved) and that the displacement devices 120, 220 can move the respective terminals 110, 210 along any suitable path or paths to enable connecting with the terminals 112a-d, 212a-d.

In accordance with one example of the present invention, a method for facilitating input/output selection is disclosed. The method can comprise providing a mechanical input/output selector comprising a first terminal for a first transmission line, a plurality of second terminals for a plurality of second transmission lines, a first displacement device operable to selectively position the first terminal proximate to any one of the plurality of second terminals, and a second displacement device operable to move the first terminal relative to the plurality of second terminals to alternately connect and disconnect the first terminal and one of the plurality of second terminals. Additionally, the method can comprise facilitating control of the first and second displacement devices. In one aspect, facilitating control of the first and second displacement devices comprises providing a control system. In another aspect, the method can further comprise providing a position sensor to provide position feedback data for positioning the first terminal. It is noted that no specific order is required in this method, though generally in one example, these method steps can be carried out sequentially.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some examples or features described herein may be combined with other examples or features described herein, this disclosure should be read to describe any such combinations that would be practicable by one of ordinary skill in the art. The user of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A mechanical input/output selector, comprising:
   a first terminal for a first transmission line;
   a plurality of second terminals for a plurality of second transmission lines;
   a first displacement device operable to selectively position the first terminal proximate to any one of the plurality of second terminals;
   a second displacement device operable to move the first terminal relative to the plurality of second terminals to alternately connect and disconnect the first terminal and one of the plurality of second terminals; and
   a carriage coupled to the first displacement device and supporting the first terminal, the carriage comprising a base coupled to the first displacement device, and a movable platform in support of the first terminal and movably coupled to the base, the movable platform being movable relative to the base by the second displacement device to connect and disconnect the first terminal and one of the plurality of second terminals.

2. The mechanical input/output selector of claim 1, wherein the first terminal and the plurality of second terminals each comprise at least one connector.

3. The mechanical input/output selector of claim 1, wherein the at least one connector comprises an electrical connector, a fluid connector, a fiber optic connector, or a combination thereof.

4. The mechanical input/output selector of claim 3, wherein the fluid connector comprises a pneumatic connector, a hydraulic connector, or a combination thereof.

5. The mechanical input/output selector of claim 1, wherein at least one of the first and second displacement devices comprises a linear actuator.

6. The mechanical input/output selector of claim 5, wherein the linear actuator comprises a linear positioning system, an electric actuator, a hydraulic actuator, a pneumatic actuator, or a combination thereof.

7. The mechanical input/output selector of claim 1, further comprising a support frame in support of the first displacement device, the second displacement device, the plurality of second terminals, or a combination thereof.

8. The mechanical input/output selector of claim 7, further comprising a guide pin to facilitate correct alignment when connecting the first terminal and one of the plurality of second terminals.

9. The mechanical input/output selector of claim 8, wherein the guide pin is associated with the movable platform or the support frame and is operable to interface with a sidewall of a guide opening in the other of the movable platform or the support frame.

10. The mechanical input/output selector of claim 1, wherein the second displacement device comprises a plurality of second displacement devices each associated with one of the plurality of second terminals.

11. The mechanical input/output selector of claim 10, wherein the movable platform comprises an interface opening, and each of the plurality of second displacement devices comprises a platform interface configured to be received within the interface opening to facilitate coupling the plurality of second displacement devices with the movable platform.

12. The mechanical input/output selector of claim 11, wherein the platform interface comprises a rail configuration.

13. The mechanical input/output selector of claim 1, wherein the second displacement device is associated with the carriage.

14. A mechanical input/output selector system, comprising:
   a mechanical input/output selector comprising
      a first terminal for a first transmission line,
      a plurality of second terminals for a plurality of second transmission lines;
      a first displacement device operable to selectively position the first terminal proximate to any one of the plurality of second terminals, and
      a second displacement device operable to move the first terminal relative to the plurality of second terminals to alternately connect and disconnect the first terminal and one of the plurality of second terminals;
      a carriage coupled to the first displacement device and supporting the first terminal, the carriage comprising a base coupled to the first displacement device, and a movable platform in support of the first terminal and movably coupled to the base, the movable platform being movable relative to the base by the second displacement device to connect and disconnect the first terminal and one of the plurality of second terminals; and
   a control system to control operation of the first and second displacement devices.

15. The system of claim 14, further comprising a position sensor to provide position feedback data for the control system to position the first terminal.

16. The system of claim 14, wherein the control system is configured to automatically control operation of the first and second displacement devices.

17. A method for facilitating input/output selection, comprising:
   providing a mechanical input/output selector comprising
      a first terminal for a first transmission line,
      a plurality of second terminals for a plurality of second transmission lines,
      a first displacement device operable to selectively position the first terminal proximate to any one of the plurality of second terminals, and
      a second displacement device operable to move the first terminal relative to the plurality of second terminals to alternately connect and disconnect the first terminal and one of the plurality of second terminals;
      a carriage coupled to the first displacement device and supporting the first terminal, the carriage comprising a base coupled to the first displacement device, and a movable platform in support of the first terminal and movably coupled to the base, the movable platform being movable relative to the base by the second displacement device to connect and disconnect the first terminal and one of the plurality of second terminals; and
   facilitating control of the first and second displacement devices.

18. The method of claim 17, wherein facilitating control of the first and second displacement devices comprises providing a control system.

19. The method of claim 17, further comprising providing a position sensor to provide position feedback data for positioning the first terminal.

* * * * *